(12) United States Patent  (10) Patent No.: US 7,981,588 B2
Hirosaki et al.  (45) Date of Patent: *Jul. 19, 2011

(54) NEGATIVE RESIST COMPOSITION AND METHOD OF FORMING RESIST PATTERN

(75) Inventors: Takako Hirosaki, Kawasaki (JP); Taku Hirayama, Kawasaki (JP); Daiju Shiono, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 529 days.

This patent is subject to a terminal disclaimer.

(21) Appl. No.: 11/813,511

(22) PCT Filed: Feb. 1, 2006

(86) PCT No.: PCT/JP2006/301679
§ 371 (c)(1),
(2), (4) Date: Jul. 6, 2007

(87) PCT Pub. No.: WO2006/082856
PCT Pub. Date: Aug. 10, 2006

(65) Prior Publication Data
US 2009/0269693 A1  Oct. 29, 2009

(30) Foreign Application Priority Data
Feb. 2, 2005  (JP) .................................. 2005-026266

(51) Int. Cl.
*G03C 1/00* (2006.01)

(52) U.S. Cl. .................................................. 430/270.1
(58) Field of Classification Search ................. 430/270.1
See application file for complete search history.

(56) References Cited

U.S. PATENT DOCUMENTS

| | | | |
|---|---|---|---|
| 5,286,600 A | 2/1994 | Ochiai et al. | |
| 5,389,491 A | 2/1995 | Tani et al. | |
| 5,658,706 A | 8/1997 | Niki et al. | |
| 5,693,452 A | 12/1997 | Aoai et al. | |
| 5,707,776 A * | 1/1998 | Kawabe et al. | 430/270.1 |
| 5,824,451 A | 10/1998 | Aoai et al. | |
| 5,837,420 A | 11/1998 | Aoai et al. | |
| 5,844,057 A | 12/1998 | Watanabe et al. | |
| 5,994,025 A | 11/1999 | Iwasa et al. | |
| 6,037,098 A | 3/2000 | Aoai et al. | |
| 6,106,993 A | 8/2000 | Watanabe et al. | |
| 6,197,473 B1 | 3/2001 | Kihara et al. | |
| 6,638,683 B1 | 10/2003 | Tan et al. | |
| 7,220,808 B2 | 5/2007 | Yamagishi et al. | |
| 7,504,196 B2 | 3/2009 | Shiono et al. | |
| 2002/0025495 A1 | 2/2002 | Ogata et al. | |
| 2002/0058205 A1* | 5/2002 | Nakashima et al. | 430/285.1 |
| 2003/0232277 A1 | 12/2003 | Sasaki et al. | |
| 2004/0005512 A1 | 1/2004 | Mizutani et al. | |
| 2004/0234885 A1* | 11/2004 | Watanabe et al. | 430/141 |
| 2005/0271971 A1 | 12/2005 | Ueda et al. | |
| 2007/0259273 A1 | 11/2007 | Shiono et al. | |
| 2007/0281243 A1 | 12/2007 | Hirayama | |
| 2008/0020288 A1 | 1/2008 | Hirayama et al. | |
| 2008/0145784 A1 | 6/2008 | Shiono et al. | |
| 2009/0162781 A1 | 6/2009 | Shiono et al. | |

FOREIGN PATENT DOCUMENTS

JP H05-061197 3/1993

(Continued)

OTHER PUBLICATIONS

International Search Report, PCT/JP2006/301679, Feb. 16, 2006.
Office Action issued in counterpart Japanese Patent Application No. 2005-026266, dated Mar. 3, 2009.
Office Action issued in counterpart Korean Patent Application No. 10-2007-7017441, dated May 7, 2009.
Decision to Grant a Patent issued in corresponding Japanese Patent Application No. 2004-182301, dated Jan. 6, 2009.

(Continued)

*Primary Examiner* — Cynthia H Kelly
*Assistant Examiner* — Connie P Johnson
(74) *Attorney, Agent, or Firm* — Knobbe, Martens, Olson & Bear, LLP

(57) ABSTRACT

There are provided a resist composition capable of forming a resist pattern with high sensitivity and high resolution, and a method of forming such a resist pattern. The negative resist composition includes an alkali soluble base component (A), an acid generator component (B) that generates acid by exposure, and a cross-linking agent component (C), wherein the base component (A) includes a polyhydric phenol compound (A1) containing two or more phenolic hydroxyl groups represented by the following general formula (I), with a molecular weight of 300 to 2500.

[Formula 1]

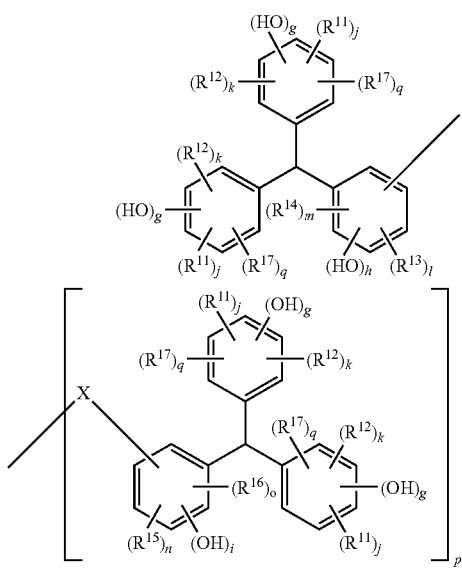

(I)

3 Claims, No Drawings

FOREIGN PATENT DOCUMENTS

| | | |
|---|---|---|
| JP | H05-249681 | 9/1993 |
| JP | A-06-083055 | 3/1994 |
| JP | H06-059444 | 3/1994 |
| JP | H06-167811 | 6/1994 |
| JP | H06-266109 A | 9/1994 |
| JP | 08-193054 | 7/1996 |
| JP | H08-220740 | 8/1996 |
| JP | H08-262712 | 10/1996 |
| JP | H09-005999 | 1/1997 |
| JP | H09-160246 | 6/1997 |
| JP | A-09-211865 | 8/1997 |
| JP | H09-211866 | 8/1997 |
| JP | H10-123703 A | 5/1998 |
| JP | A 10-274845 | 10/1998 |
| JP | A-11-153863 | 6/1999 |
| JP | H11-167199 | 6/1999 |
| JP | 11199533 | 7/1999 |
| JP | 2000-086584 | 3/2000 |
| JP | 2000-305270 | 11/2000 |
| JP | 2000-330282 | 11/2000 |
| JP | 2000330282 | 11/2000 |
| JP | 2001-312055 | 11/2001 |
| JP | 2002-055452 | 2/2002 |
| JP | 2002099088 | 4/2002 |
| JP | 2002099089 | 4/2002 |
| JP | 2002-221787 | 8/2002 |
| JP | A-2002-328473 | 11/2002 |
| JP | A-2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | A-2004-191913 | 7/2004 |
| JP | 2004302440 | 10/2004 |
| JP | 2004359590 | 12/2004 |
| JP | 2005-089387 | 4/2005 |
| JP | 2005-091909 | 4/2005 |
| JP | 2005-309421 | 11/2005 |
| KR | 0231242 | 5/1997 |
| KR | 2001-0088341 | 9/2001 |
| KR | 10-0406242 | 11/2003 |
| TW | 200302397 A | 8/2003 |
| TW | 200617602 | 6/2006 |
| WO | WO 2006/046383 | 5/2006 |

OTHER PUBLICATIONS

Hirayama et al., Journal of Photopolymer Science and Technology, vol. 17, No. 3, 435-440, (2004).

Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488 (published on Jul. 26, 2005).

International Search Report from PCT/JP2006/302271, mailed on Mar. 7, 2006.

International Search Report in connection with corresponding PCT application No. PCT/JP2006/313103, dated Sep. 26, 2006.

International Search Report issued in corresponding PCT Application No. PCT/JP2006/311443, dated Jun. 7, 2006.

Office Action issued for Japanese Patent Application No. 2004-260764, the counterpart of related U.S. Appl. No. 11/574,805., dated Mar. 3, 2009.

Office Action issued in the counterpart Japanese Patent Application No. 2005-050721, dated Mar. 3, 2009.

Office Action issued on counterpart Japanese Patent Application No. 2004-182300, dated May 27, 2008.

Office Action issued on counterpart Japanese Patent Application No. JP 2005-050721, dated Jul. 28, 2009.

Office Action issued on Korean Patent Application No. 10-2007-7004390, dated Dec. 17, 2008.

Office Action issued on Korean Patent Application No. 10-2008-7025851, dated Jan. 7, 2009.

Office Action issued on the counterpart Japanese Patent Application No. 2004-182301, dated Aug. 26, 2008.

Office Action issued on the counterpart Japanese Patent Application No. 2004-182301, dated Jun. 3, 2008.

Office Action issued on the counterpart Korean Patent Application No. 10-2007-7019433, dated Jun. 5, 2008.

Office Action issued on the counterpart Taiwanese Patent Application No. 094104523, dated May 12, 2008.

Yamaguchi et al., "Linewidth fluctuations caused by polymer aggregates in resist films," Journal of Photopolymer Science and Technology, vol. 10 No. 4, pp. 635-640, (1997).

Office Action issued on Korean Patent Application No. 10-2007-7004390, dated Apr. 14, 2008.

International Search Report issued in corresponding PCT application No. PCT/JP2005/013564, mailed Sep. 6, 2005.

International Search Report issued in corresponding PCT application No. PCT/JP2005/018143, mailed Nov. 15, 2005.

Notice of Allowance issued in related Korean Patent Application No. 10-2009-7006750, dated Feb. 16, 2010.

Office Action issued Sep. 16, 2008 in the counterpart Korean Patent Application No. 10-2007-7010473.

European Search Report issued on counterpart European Patent Application No. EP 06732357.6, dated Aug. 30, 2010.

Hirayama et al, "Development of Amorphous PolyPhenol Resists with Low Molecular Weight and Narrow Dispersion for EB Lithography", IEEE Xplore, Oct. 22, 2004, pp. 10-11.

Notice of Allowance issued on corresponding Japanese Patent Application No. 2004-260764, dated Feb. 16, 2010.

European Search Report issued in related European Patent Application No. EP 05788289.6, dated Jul. 26, 2010.

Notice of Allowance issued in related U.S. Appl. No. 11/718,091 dated Aug. 10, 2010.

Notice of Allowance issued in related U.S. Appl. No. 11/917,458, dated Sep. 7, 2010.

European Search Report issued on counterpart European Patent Application No. EP 10194369.4, dated Feb. 17, 2011.

* cited by examiner

NEGATIVE RESIST COMPOSITION AND METHOD OF FORMING RESIST PATTERN

RELATED APPLICATIONS

This application is the U.S. National Phase filing under 35 U.S.C. §371 of PCT/JP2006/301679, filed Feb. 1, 2006, which designated the United States and was published in a language other than English, which claims priority under 35 U.S.C. §119(a)-(d) to Japanese Patent Application No. 2005-026266, filed Feb. 2, 2005. The content of these applications is incorporated herein by reference in their entireties.

BACKGROUND ART

In recent years, in the production of semiconductor elements and liquid crystal display elements, advances in lithography techniques have led to rapid progress in pattern miniaturization.

Typically, these miniaturization techniques involve shortening of the wavelength of the exposure light source. Specifically, conventionally, ultraviolet radiation such as g-lines and i-lines had been used, but currently, mass production of semiconductor elements using KrF excimer lasers or ArF excimer lasers has been started. Moreover, $F_2$ excimer lasers, electron beams, EUV (extreme ultraviolet), and X rays, whose wavelengths are shorter than those of the above excimer lasers, are also being examined.

Furthermore, one example of a known pattern forming material capable of forming patterns with very fine dimensions, is a chemically amplified resist including a base component capable of forming a film, and an acid generator component that generates acid by exposure. Such chemically amplified resists include negative resists, in which the alkali solubility decreases by exposure, and positive resists, in which the alkali solubility increases by exposure.

Conventionally, polymers are used as base components of chemically amplified resists. For example, PHS based resins such as polyhydroxystyrene (PHS) and such resins in which a part of the hydroxyl group is protected by an acid dissociable, dissolution inhibiting group, copolymers derived from (meth) acrylic esters, and such resins in which a part of the carboxy group is protected by an acid dissociable, dissolution inhibiting group, and the like are used.

For example, as the negative chemically amplified resists, those including an alkali soluble resin such as PHS, an acid generator component, and a cross-linking agent are typically used. In such a resist, the resin and the cross-linking agent are cross-linked under the action of the acid generated from the acid generator component by exposure, thus converting from an alkali soluble state to an alkali insoluble state.

However, pattern formation using such a pattern forming material involves a problem of roughness on the top surface or the side wall surface of the pattern. For example, roughness on the side wall surface of the resist pattern, namely, line edge roughness (LER), causes distortions around holes in a hole pattern, and non-uniform irregularities in the line width in a line and space pattern, and thus may negatively affect the miniaturization of semiconductor elements.

Such a problem becomes more serious as the pattern dimension gets smaller. Therefore, an object of lithography using electron beams or EUV is to form fine patterns of about several dozens nm, and thus much less roughness than the current pattern roughness is required.

However, a polymer typically used as the base component is as large as several nm in molecular size (mean-square radius per one molecule). In the developing step of pattern formation, dissolving behavior of a resist in a developing solution is normally performed per each molecule unit of the base component, and therefore the further reduction of roughness is very difficult so long as a polymer is used as the base component.

In response to such a problem, a resist using a low molecular material as the base component has been proposed as a material in order to obtain very little roughness. For example, patent references 1 and 2 have proposed a low molecular material containing an alkali soluble group such as a hydroxyl group, in which a part of or all of the alkali soluble group is protected by an acid dissociable, dissolution inhibiting group.

[Patent Reference 1]

Japanese Unexamined Patent Application, First Publication No. 2002-099088 [Patent Reference 2]

Japanese Unexamined Patent Application, First Publication No. 2002-099089

DISCLOSURE OF INVENTION

Problems to be Solved by the Invention

Currently, in the progress in pattern miniaturization, higher sensitivity of the resist is required in order to deal with the decrease in the intensity of the light source due to the shortening of the wavelength of the exposure light source, and to improve the throughput. In particular, it is important to improve the sensitivity in a process using electron beams or EUV.

However, in conventional techniques, it is difficult to satisfy both high sensitivity and high resolution. For example, a method of increasing the concentration of an acid generator in a chemically amplified resist can be considered as a method for achieving an improvement in the sensitivity of the resist. However, in a conventional chemically amplified resist, because the resolution is prone to decrease when a high concentration of acid generator is added, it is difficult to include high concentration of an acid generator, and thus the improvement of the sensitivity has the limitation.

The present invention takes the above circumstances into consideration, with an object of providing a resist composition which is capable of forming a resist pattern of high sensitivity and high resolution, and a method of forming such a resist pattern.

Means for Solving the Problems

As a result of intensive investigations, the inventors of the present invention found that the problems described above could be resolved by a negative resist composition including a polyhydric phenol compound with a specific structure and a specific molecular weight, and they have hence completed the present invention.

That is, a first aspect of the present invention is a negative resist composition including an alkali soluble base component (A), an acid generator component (B) that generates acid by exposure, and a cross-linking agent component (C), wherein the base component (A) includes a polyhydric phenol compound (A1) containing two or more phenolic hydroxyl groups represented by the following general formula (I), with a molecular weight of 300 to 2500.

[Formula 1]

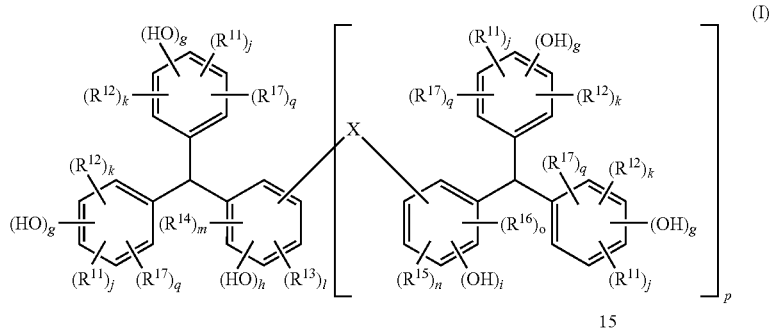

[In the formula (I), $R^{11}$ to $R^{17}$ each represent, independently, an alkyl group of 1 to 10 carbon atoms, or an aromatic hydrocarbon group, which may contain hetero atoms in the structure; g and j each represent, independently, an integer of 1 or more; k and q each represent independently, an integer of 0 or more; g+j+k+q is 5 or less; h represents an integer of 1 or more; l and m each represent, independently, an integer of 0 or more; h+l+m is 4 or less; i represents an integer of 1 or more; n and o each represent, independently, an integer of 0 or more; i+n+o is 4 or less; p represents 0 or 1; and X is a group represented by the following general formula (Ia) or (Ib).]

[Formula 2]

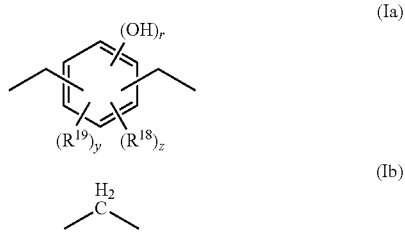

[In the formula (Ia), $R^{18}$ and $R^{19}$ each represent, independently, an alkyl group of 1 to 10 carbon atoms, or an aromatic hydrocarbon group, which may contain hetero atoms in the structure; r, y, and z each represent, independently, an integer of 0 or more, and r+y+z is 4 or less.]

A second aspect of the present invention is a method of forming a resist pattern comprising the steps of: forming a resist film using a negative resist composition according to the first aspect, onto a substrate; exposing the resist film; and developing the resist film to form a resist pattern.

In the present invention, the term "exposure" is used as a general concept including irradiation with any form of radiation, such as excimer lasers, electron beams, ultraviolet radiation, X rays, and the like.

EFFECTS OF THE INVENTION

The negative resist composition and the method of forming a resist pattern according to the present invention enable to form a resist pattern with high sensitivity and high resolution.

BEST MODE FOR CARRYING OUT THE INVENTION

[Negative Resist Composition]

The negative resist composition of the present invention comprises an alkali soluble resin component (A) (hereafter also referred to as the component (A)), an acid generator component (B) that generates acid by exposure (hereafter also referred to as the component (B)), and a cross-linking agent component (C) (hereafter also referred to as the component (C)).

In such a negative resist composition, when an acid is generated from the component (B) by exposure (irradiation with radiation) in order to form a resist pattern, the component (A) and the component (C) are cross-linked under the action of the acid, thus converting to an alkali insoluble state. As a result, in the formation of a resist pattern, when a resist film including the negative resist composition is subjected to selective exposure, or additional heating followed by the exposure, the exposed portions are converted to an alkali insoluble state, while unexposed portions are not converted but stay in the alkali soluble state. Therefore, a negative resist pattern can be formed by performing alkali developing.

<Component (A)>

In the negative resist composition of the present invention, the component (A) has to include a polyhydric phenol compound (A1) having two or more hydroxyl groups represented by the following general formula (I), with a molecular weight of 300 to 2500.

The polyhydric phenol compound (A1) preferably contain 3 or more phenolic hydroxyl groups, and more preferably 4 to 10 phenolic hydroxyl groups. By so doing, a satisfactory alkali soluble state can be obtained.

In the formula (I), $R^{11}$ to $R^{17}$ each represent, independently, linear, branched, or cyclic alkyl group of 1 to 10 carbon atoms, or an aromatic hydrocarbon group.

The alkyl group is preferably a linear or branched lower alkyl group of 1 to 5 carbon atoms, or a cyclic alkyl group of 5 or 6 carbon atoms. Examples of the lower alkyl group include linear or branched alkyl groups such as a methyl group, an ethyl group, a propyl group, an isopropyl group, an n-butyl group, an isobutyl group, a tert-butyl group, a pentyl group, an isopentyl group, and a neopentyl group. Examples of the cyclic alkyl group include a cyclohexyl group and a cyclopentyl group.

The aromatic hydrocarbon group is preferably a group of 6 to 15 carbon atoms. Examples thereof include a phenyl group, a tolyl group, a xylyl group, a mesityl group, a phenethyl group, and a naphthyl group.

These alkyl group or aromatic hydrocarbon group may contain hetero atoms such as an oxygen atom, a nitrogen atom, and a sulfur atom in the structure.

$R^{11}$ to $R^{17}$ are preferably methyl groups or cyclohexyl groups from the viewpoint of achieving an excellent effect of the present invention.

g and j each represent, independently, an integer of 1 or more, and more preferably an integer of 1 or 2. k and q each represent, independently, an integer of 0 or more, more preferably an integer not more than 2. Moreover, g+j+k+q is 5 or less.

h represents an integer of 1 or more, and more preferably an integer of 1 or 2. l and m each represent, independently, an integer of 0 or more, more preferably an integer not more than 2. Moreover, h+l+m is 4 or less.

i represents an integer of 1 or more, and more preferably an integer of 1 or 2. n and o each represent, independently, an integer of 0 or more, more preferably an integer not more than 2. Moreover, i+n+o is 4 or less.

p represents 0 or 1, and more preferably 1.

X is a group represented by the above general formula (Ia) or (Ib).

In the general formula (Ia), alkyl groups or aromatic hydrocarbon groups of $R^{18}$ and $R^{19}$ are the same as those described for the alkyl groups or aromatic hydrocarbon groups of $R^{11}$ to $R^{17}$. Of these, $R^{18}$ and $R^{19}$ are preferably methyl groups from the viewpoint of achieving an excellent effect of the present invention.

r, y, and z each represent, independently, an integer of 0 or more, and r+y+z is 4 or less. Of these, preferably, r represents 1, and y+z is 1.

Of these, compounds (A1-1) in which p represents 1, $R^{11}$ represents a lower alkyl group or a cycloalkyl group, j represents 1, $R^{12}$ represents a lower alkyl group, k represents 1, and g represents 1 are preferable, because they enable to form a pattern with reduced roughness and high resolution. In particular, compounds (A1-1) in which q, l, m, n, and o are 0, and h and i are both 1 are preferred.

Examples of the polyhydric phenol compound (A1) include compounds represented by the following formulas (I-11), (I-12), (I-13), and (I-14).

[Formula 3]

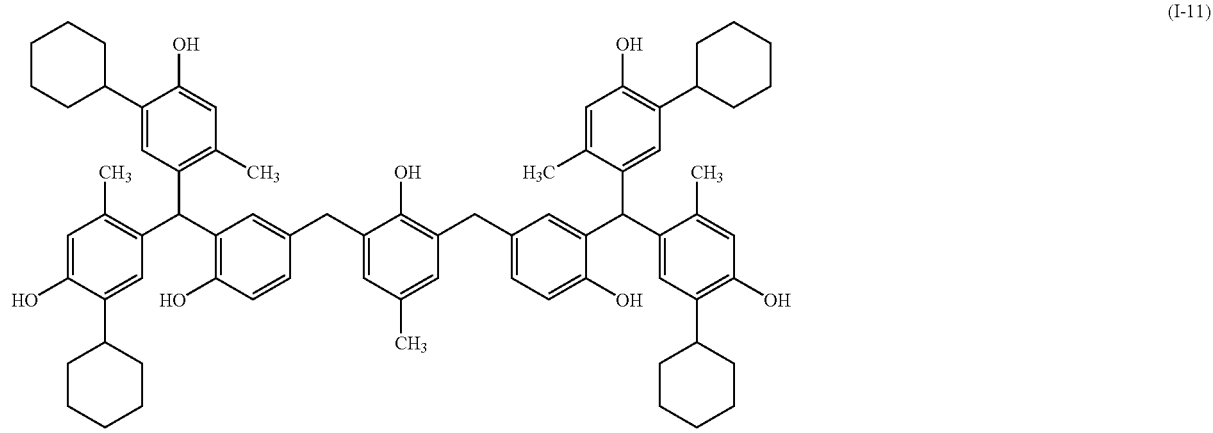

(I-11)

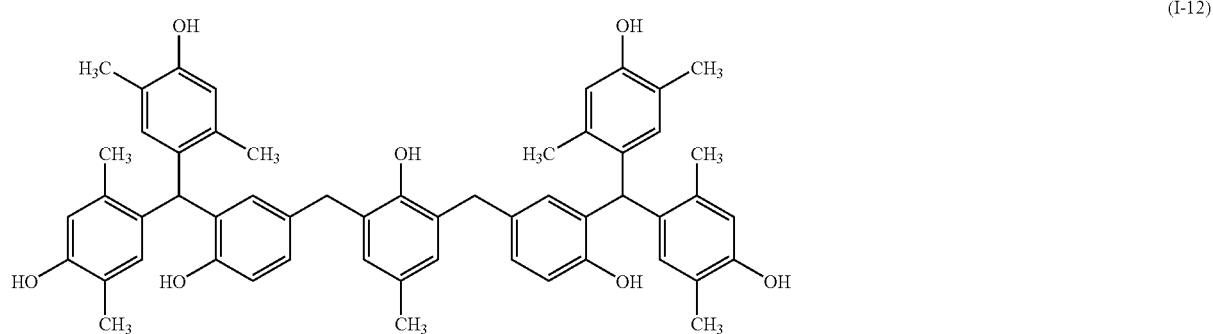

(I-12)

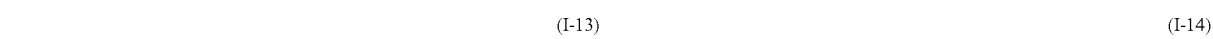

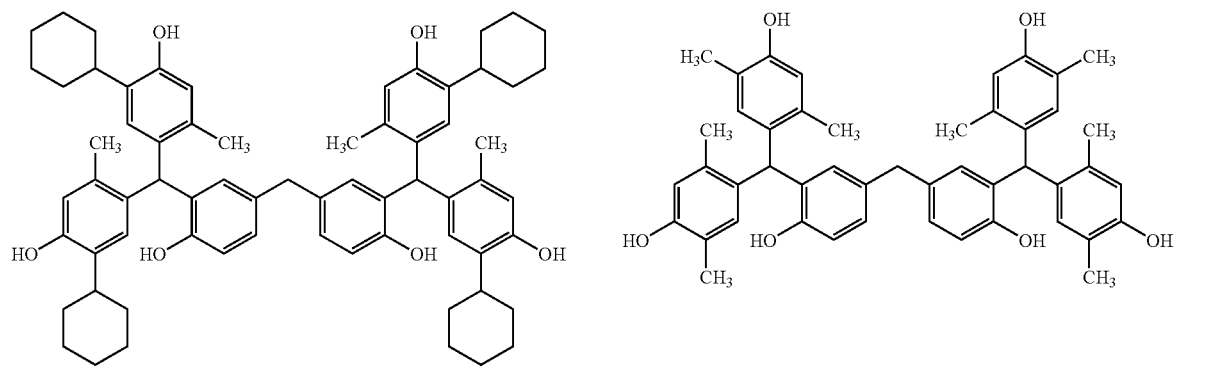

(I-13)       (I-14)

In the present invention, in order to achieve the effect of the present invention, the polyhydric phenol compound (A1) has a molecular weight of 300 to 2500, more preferably 450 to 1500, and even more preferably 500 to 1200. When the molecular weight is within the above range, a pattern with reduced roughness can be formed, and the profile shape of a resist pattern is excellent.

The polyhydric phenol compound (A1) is a material capable of forming an amorphous film by a spincoating method.

Here, the term "spincoating method" means one of the typically-used thin film forming methods, and the term "amorphous film" means an optically transparent film that is not crystallized.

Whether or not the polyhydric phenol compound is a material capable of forming an amorphous film by a spincoating method can be judged by whether the whole surface of the coated film formed on an 8 inch silicon wafer by a spincoating method is transparent or not. More specifically, for example, it can be judged as follows. Firstly, the polyhydric phenol compound is dissolved using a solvent typically used for a resist solvent, for example, a mixed solvent of ethyl lactate/propylene glycol monomethylether acetate=40/60 (mass ratio) (hereinafter referred to as EM) at a concentration of 14% by weight, and then subjected to an ultrasonic treatment (dissolving treatment) using an ultrasonic cleaner in order to be further dissolved. The resultant solution is spincoated on a wafer at 1500 rpm, and then optionally dry baked (PAB: Post Applied Bake) at 110° C. for 90 seconds. In this condition, it is confirmed whether or not an amorphous film is formed by discriminating whether the film is transparent or not. An translucent film, which is not transparent, is not an amorphous film.

Furthermore, as the polyhydric phenol compound (A1), it is preferable that the amorphous film formed in the above manner has an excellent stability. For example, preferably, the film is kept in a transparent state, namely, an amorphous state, even if the film is left at room temperature for two weeks after the PAB.

In the component (A), either a single polyhydric phenol compound (A1) or a combination of two or more polyhydric phenol compounds (A1), such as a plurality of compounds having different numbers of hydroxyl groups, or different types or numbers of substituents, may be used.

If two or more compounds are contained as the polyhydric phenol compound (A1), it is preferable that the structures (such as the numbers of hydroxyl groups, or the types or numbers of substituents) of the plurality of different polyhydric phenol compounds are nearer to the same structures.

As a result, the effect of present invention can be exerted, and the roughness is also reduced.

In the component (a), the proportion of the polyhydric phenol compound (Al) is preferably more than 40% by weight, more preferably more than 50% by weight, even more preferably more than 80% by weight, and most preferably 100% by weight.

The polyhydric phenol compound (A1) can be produced by a typically known method, for example, a method described in Japanese Unexamined Patent Application, First Publication No. Hei 11-199533.

The component (A) may further contain any of the proposed resin component as a base component for chemically amplified resist layers, within the range that the effect of the present invention is not reduced.

Examples of such a resin component include those proposed as a conventional base resin such as a chemically amplified negative resist composition for KrF and a negative resist composition for ArF, which may be appropriately selected according to the type of the exposure light source used for forming a resist pattern.

The quantity of the component (A) within a negative resist composition of the present invention can be adjusted in accordance with the thickness of the resist film that is desired.

<Component (B)>

As the component (B), any of the proposed acid generators for conventional chemically amplified resist compositions can be used without any particular restriction. There are a multitude of known acid generators, including: onium salt-based acid generators such as iodonium salts and sulfonium salts; oxime sulfonate-based acid generators; diazomethane-based acid generators such as bisalkyl or bisaryl sulfonyl diazomethanes, and poly(bis-sulfonyl)diazomethanes; nitrobenzyl sulfonate-based acid generators; iminosulfonate-based acid generators; and disulfone-based acid generators.

Examples of the onium salt based acid generator include compounds represented by the following general formulas (b-1) and (b-2).

[Formula 4]

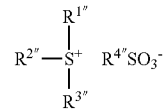

(b-1)

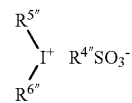

(b-2)

[In the formula, $R^{1''}$ to $R^{3''}$, $R^{5''}$, and $R^{6''}$ each represent, independently, an aryl group or an alkyl group; $R^{4''}$ represents a linear, branched, or cyclic alkyl group or fluorinated alkyl group; at least one of the groups $R^{1''}$ to $R^{3''}$ represents an aryl group, and at least one of the groups $R^{5''}$ and $R^{6''}$ represents an aryl group.]

In the formula (b-1), $R^{1''}$ to $R^{3''}$ each represent, independently, an aryl group or an alkyl group. Of the groups $R^{1''}$ to $R^{3''}$, at least one group represents an aryl group. Preferably two or more of $R^{1''}$ to $R^{3''}$ are aryl groups, and more preferably all of $R^{1''}$ to $R^{3''}$ are aryl groups.

There are no particular restrictions on the aryl groups of $R^{1''}$ to $R^{3''}$, and examples thereof include aryl groups of 6 to 20 carbon atoms, in which a part of or all of the hydrogen atoms may, or may not, be substituted with alkyl groups, alkoxy groups, or halogen atoms, or the like. In terms of enabling low cost synthesis, aryl groups of 6 to 10 carbon atoms are preferred. Specific example thereof include phenyl groups and naphthyl groups.

As the alkyl group with which the hydrogen atom may be substituted in the aryl group, an alkyl group of 1 to 5 carbon atoms is preferred, and a methyl group, an ethyl group, a propyl group, an n-butyl group, and a tert-butyl group are most preferable.

As the alkoxy group with which the hydrogen atoms may be substituted in the aryl group, an alkoxy group of 1 to 5 carbon atoms is preferable, and a methoxy group and an ethoxy group are most preferable.

As the halogen atom with which the hydrogen atom may be substituted in the aryl group, a fluorine atom is preferable.

There are no particular restrictions on the alkyl groups of $R^{1''}$ to $R^{3''}$, and examples thereof include linear, branched, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. In terms of achieving excellent resolution and enabling low cost synthesis, a methyl group is most preferred.

Of the above possibilities, it is most preferable that $R^{1\prime\prime}$ to $R^{3\prime\prime}$ are all phenyl groups.

$R^{4\prime\prime}$ represents a linear, branched, or cyclic alkyl group, or a fluorinated alkyl group.

The linear alkyl group is preferably a group of 1 to 10 carbon atoms, more preferably a group of 1 to 8 carbon atoms, and most preferably a group of 1 to 4 carbon atoms.

The cyclic alkyl group is preferably a cyclic group as shown in the above $R^{1\prime\prime}$ of 4 to 15 carbon atoms, more preferably a group of 4 to 10 carbon atoms, and most preferably a group of 6 to 10 carbon atoms.

The fluorinated alkyl group is preferably a group of 1 to 10 carbon atoms, more preferably a group of 1 to 8 carbon atoms, and most preferably a group of 1 to 4 carbon atoms. Moreover. The fluorination ratio of the fluorinated alkyl group (fluorine atom proportion within the alkyl group) is preferably within a range from 10 to 100%, and more preferably from 50 to 100%, and groups in which all of the hydrogen atoms have been substituted with fluorine atoms are particularly preferable since the acid becomes stronger.

Of these, it is most preferred that $R^{4\prime\prime}$ is a linear or cyclic alkyl group, or a fluorinated alkyl group.

In the formula (b-2), $R^{5\prime\prime}$ and $R^{6\prime\prime}$ each represent, independently, an aryl group or an alkyl group. Of the groups $R^{5\prime\prime}$ and $R^{6\prime\prime}$, at least one group represents an aryl group. Both of $R^{5\prime\prime}$ and $R^{6\prime\prime 1}$ are aryl groups are preferred.

Aryl groups of $R^{5\prime\prime}$ and $R^{6\prime\prime}$ are the same as those described for the aryl groups of $R^{1\prime\prime}$ to $R^{3\prime\prime}$.

Alkyl groups of $R^{5\prime\prime}$ and $R^{6\prime\prime}$ are the same as those described for the alkyl groups of $R^{1\prime\prime}$ to $R^{3\prime\prime}$.

Of the above possibilities, it is most preferred that $R^{5\prime\prime}$ and $R^{6\prime\prime}$ are all phenyl groups.

$R^{4\prime\prime}$ in the formula (b-2) is the same as that described for the $R^{4\prime\prime}$ in the formula (b-1).

Specific examples of onium salt-based acid generators include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate, or nonafluorobutanesulfonate; tri(4-methylphenyl)sulfonium trifluoromethanesulfonate, heptafluoropropanesulfonate, or nonafluorobutanesulfonate; dimethyl(4-hydroxynaphthyl)sulfonium trifluoromethanesulfonate, heptafluoropropanesulfonate, or nonafluorobutanesulfonate; monophenyldimethylsulfonium trifluoromethanesulfonate, heptafluoropropanesulfonate, or nonafluorobutanesulfonate; diphenylmonomethylsulfonium trifluoromethanesulfonate, heptafluoropropanesulfonate, or nonafluorobutanesulfonate; (4-methylphenyl)disulfonium trifluoromethanesulfonate, heptafluoropropanesulfonate, or nonafluorobutanesulfonate; (4-methoxyphenyl)diphenylsulfonium trifluoromethanesulfonate, heptafluoropropanesulfonate, or nonafluorobutanesulfonate, tri(4-tert-butyl)phenylsulfonium trifluoromethanesulfonate, heptafluoropropanesulfonate, or nonafluorobutanesulfonate; and diphenyl(1-(4-methoxy)naphthylsulfonium trifluoromethanesulfonate, heptafluoropropanesulfonate, or nonafluorobutanesulfonate. Moreover, onium salts in which the anionic site is substituted with methanesulfonate, n-propanesulfonate, n-butanesulfonate, or n-octanesulfonate, may be also used.

Furthermore, onium salts in which the anionic site of the above general formula (b-1) or (b-2) is substituted with an anionic site represented by the following general formula (b-3) or (b-4), may be also used (cationic site is the same as that in (b-1) or (b-2)).

[Formula 5]

(b-3)

(b-4)

[In the formula, X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the number of carbon atoms within the alkylene group is within a range from 2 to 6, preferably from 3 to 5, and most preferably 3.

Y" and Z" each represent, independently, a linear or branched alkyl group in which at least one hydrogen atom has been substituted with a fluorine atom, and the number of carbon atoms within the alkyl group is within a range from 1 to 10, preferably from 1 to 7, and most preferably from 1 to 3.

Lower numbers of carbon atoms within the alkylene group X" or the alkyl groups Y" and Z" in the above ranges of carbon atoms result in better solubility within the resist solvent, and are consequently preferred.

Moreover, greater numbers of hydrogen atoms substituted with fluorine atoms in the alkylene group X" or the alkyl groups Y" and Z" result in a stronger acid, and improvement of the transparency to high energy light beams of 200 nm or less or electron beams, and are consequently preferred. The proportion of fluorine atoms within the alkylene group or alkyl groups, namely the fluorination ratio, is preferably within a range from 70 to 100%, and more preferably from 90 to 100%, and perfluoroalkylene or perfluoroalkyl groups in which all of the hydrogen atoms have been substituted with fluorine atoms are most preferred.

In the present invention, the term "oxime sulfonate-based acid generator" is referred to as a compound including at least one group represented by the following general formula (B-1), with a property of generating acid by irradiation with radiation. As such an oxime sulfonate-based acid generator, any oxime sulfonate-based acid generator often used for a chemically amplified resist composition can be selected and used.

[Formula 6]

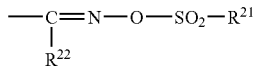

(B-1)

[In the formula (B-1), $R^{21}$ and $R^{22}$ each represent, independently, an organic group.]

In the present invention, the term "organic group" means a group which contains a carbon atom, and may contain atoms other than a carbon atom (such as a hydrogen atom, an oxygen atom, a nitrogen atom, a sulfur atom, and a halogen atom (fluorine atom, chlorine atom, and the like)).

The organic group of $R^{21}$ is preferably a linear, branched, or cyclic alkyl group or aryl group. These alkyl group and aryl group may contain a substituent. There are no particular restrictions on the substituent, and suitable examples of the substituent include a fluorine atom, or linear, branched, or cyclic alkyl groups of 1 to 6 carbon atoms. Here, the term "contain a substituent" means that a part of or all of hydrogen atoms in the alkyl group or the aryl group are substituted with substituents.

The alkyl group is preferably a group of 1 to 20 carbon atoms, more preferably a group of 1 to 10 carbon atoms, even more preferably a group of 1 to 8 carbon atoms, even more preferably a group of 1 to 6 carbon atoms, and most preferably a group of 1 to 4 carbon atoms. In particular, partially or completely halogenated alkyl groups (hereinafter also referred to as the halogenated alkyl group) are preferred. The term "partially halogenated alkyl group" means an alkyl group in which a part of the hydrogen atoms are substituted with halogen atoms, and the term "completely halogenated alkyl group" means an alkyl group in which all of the hydrogen atoms are substituted with halogen atoms. Examples of the halogen atom include a fluorine atom, a chlorine atom, a bromine atom, and an iodine atom, and a fluorine atom is particularly preferred. That is, the halogenated alkyl group is preferably a fluorinated alkyl group.

The aryl group is preferably a group of 4 to 20 carbon atoms, more preferably a group of 4 to 10 carbon atoms, and most preferably a group of 6 to 10 carbon atoms. In particular, partially or completely halogenated aryl groups are preferred. The term "partially halogenated aryl group" means an aryl group in which a part of the hydrogen atoms are substituted with halogen atoms, and the term "completely halogenated aryl group" means an aryl group in which all of the hydrogen atoms are substituted with halogen atoms.

In particular, $R^{21}$ is preferably an alkyl group of 1 to 4 carbon atoms which does not contain a substituent, or a fluorinated alkyl group of 1 to 4 carbon atoms.

The organic group of $R^{22}$ is preferably a linear, branched, or cyclic alkyl group or aryl group, or a cyano group. Alkyl groups and aryl groups of $R^{22}$ are the same as those described for the alkyl groups and aryl groups of $R^{21}$.

In particular, $R^{22}$ is preferably a cyano group, an alkyl group of 1 to 8 carbon atoms which does not contain a substituent, or a fluorinated alkyl group of 1 to 8 carbon atoms.

More preferable examples of the oxime sulfonate-based acid generator include compounds represented by the following general formulas (B-2) and (B-3).

[Formula 7]

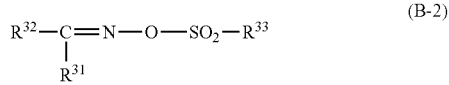

(B-2)

[In the formula (B-2), $R^{31}$ represents a cyano group, an alkyl group which does not contain a substituent, or a halogenated alkyl group. $R^{32}$ represents an aryl group. $R^{33}$ represents an alkyl group which does not contain a substituent, or a halogenated alkyl group.]

[Formula 8]

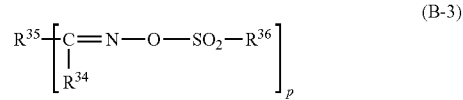

(B-3)

[In the formula (B-3), $R^{34}$ represents a cyano group, an alkyl group which does not contain a substituent, or a halogenated alkyl group. $R^{35}$ represents a divalent or trivalent aromatic hydrocarbon group. $R^{36}$ represents an alkyl group which does not contain a substituent, or a halogenated alkyl group. p represents an integer of 2 or 3.]

In the general formula (B-2), the alkyl group which does not contain a substituent or the halogenated alkyl group of $R^{31}$ is preferably a group of 1 to 10 carbon atoms, more preferably a group of 1 to 8 carbon atoms, and most preferably a group of 1 to 6 carbon atoms.

$R^{31}$ is preferably a halogenated alkyl group, and more preferably a fluorinated alkyl group.

Regarding the fluorinated alkyl group of $R^{31}$, preferably 50% or more of hydrogen atoms in the alkyl group are fluorinated, more preferably 70% or more are fluorinated, and even more preferably 90% or more are fluorinated.

Examples of the aryl group of $R^{32}$ include aromatic hydrocarbon groups in which one hydrogen atom is removed, such as a phenyl groups, a biphenyl group, a fluorenyl group, a naphthyl group, an anthracyl group, and a phenanthryl group, and heteroaryl groups in which a part of the carbon atoms constituting a ring of these groups are substituted with hetero atoms such as an oxygen atom, a sulfur atom, a nitrogen atom, or the like. Of these, a fluorenyl group is preferred.

The aryl group of $R^{32}$ may have a substituent such as an alkyl group, halogenated alkyl group, or alkoxy group of 1 to 10 carbon atoms. The number of carbon atoms within the alkyl group or the halogenated alkyl group of the substituent is preferably 1 to 8, and more preferably 1 to 4. Moreover, the halogenated alkyl group is preferably a fluorinated alkyl group.

The alkyl group which does not contain a substituent, or the halogenated alkyl group of $R^{33}$ is preferably a group of 1 to 10 carbon atoms, more preferably a group of 1 to 8 carbon atoms, and most preferably a group of 1 to 6 carbon atoms.

$R^{33}$ is preferably a halogenated alkyl group, and more preferably a partially or completely fluorinated alkyl group.

Regarding the fluorinated alkyl group of $R^{33}$, preferably 50% or more of the hydrogen atoms in the alkyl group are fluorinated, more preferably 70% or more are fluorinated, and even more preferably 90% or more are fluorinated, since the generated acid becomes stronger. The most preferable is a completely fluorinated alkyl group in which 100% of hydrogen atoms are substituted with fluorine.

In the general formula (B-3), the alkyl group which does not contain a substituent, or the halogenated alkyl group of $R^{34}$ are the same as those described for the alkyl group which does not contain a substituent, or the halogenated alkyl group of $R^{31}$.

Examples of the divalent or trivalent aromatic hydrocarbon group of $R^{35}$ include aryl groups of $R^{32}$ in which further one or two hydrogen atoms are removed.

The alkyl group which does not contain a substituent, or the halogenated alkyl group of $R^{36}$ are the same as those described for the alkyl group which does not contain a substituent, or the halogenated alkyl group of $R^{33}$.

Preferably, p represents 2.

Specific examples of oxime sulfonate-based acid generators include
α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide,
α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thiene-2-ylacetonitrile,
α-(4-dodecylbenzenesulfonyloxyimino)-benzyl cyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-propylsulfonyloxyimino)-p-methylphenylacetonitrile, and
α-(methylsulfonyloxyimino)-p-bromophenylacetonitrile.

Moreover, compounds (compound groups (i) to (iii)) represented by the following formulas are included as the examples of oxime sulfonate-based acid generators.
(Compound Group (i))

[Formula 9]

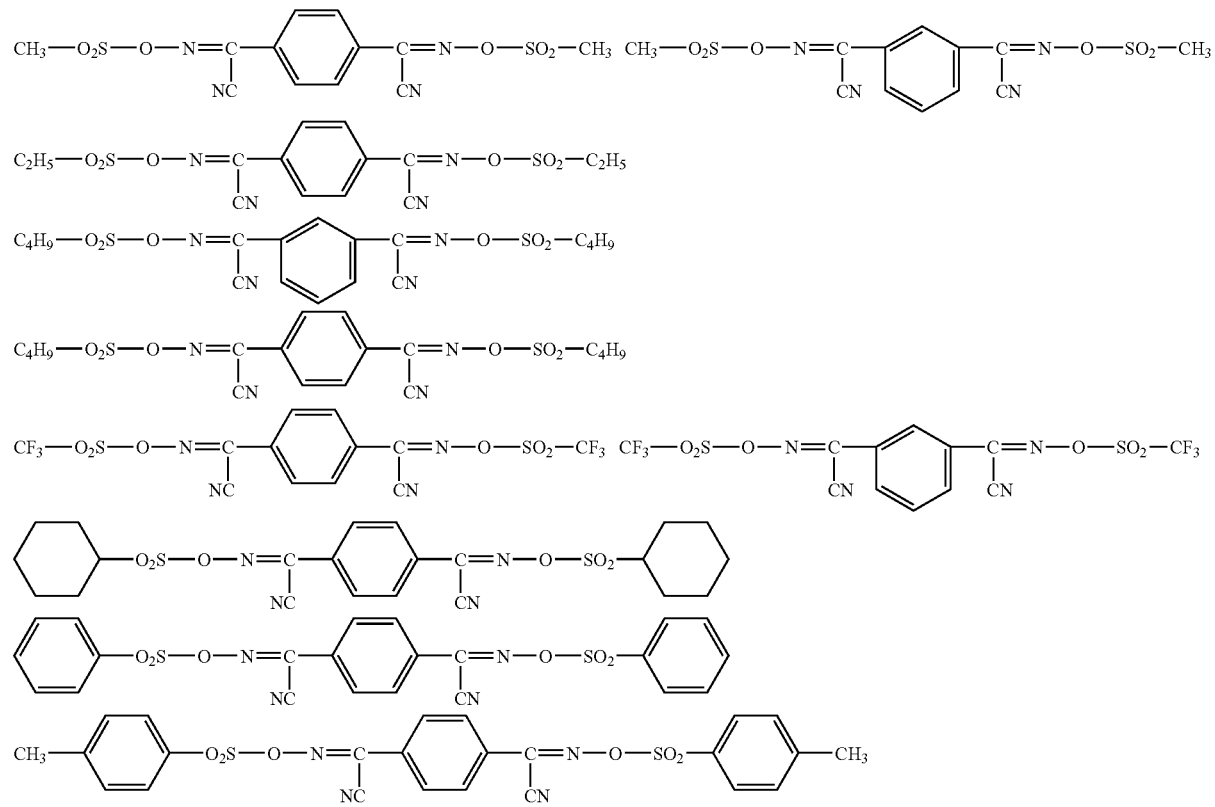

Moreover, preferred examples of the compounds represented by the above general formulas (B-2) and (B-3) are shown below.

(Compound Group (ii))

-continued

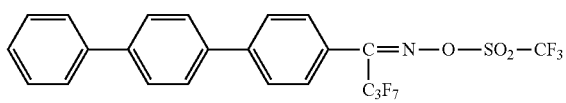

(Compound Group (iii))

[Formula 11]

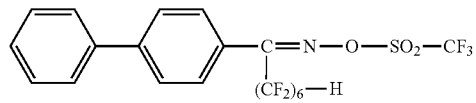
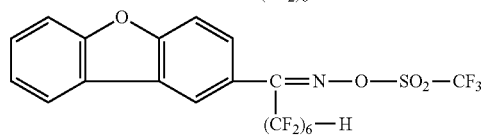
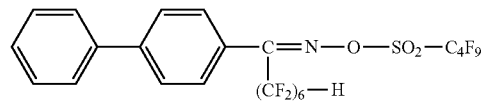
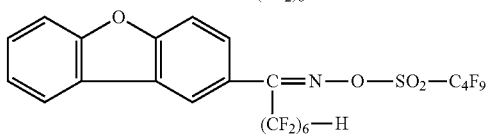
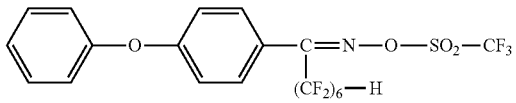
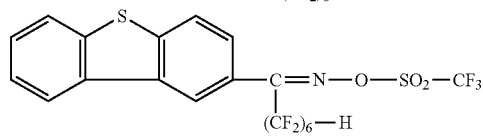
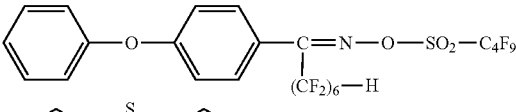
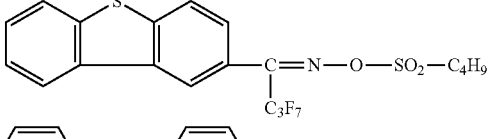
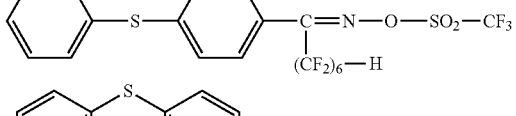
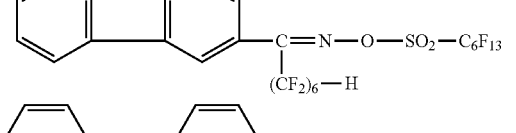
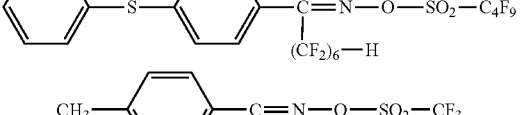
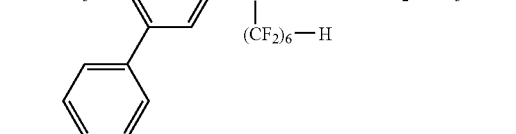
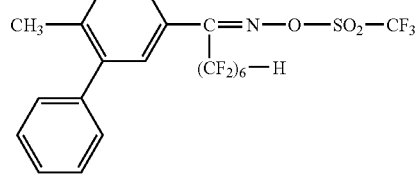

-continued

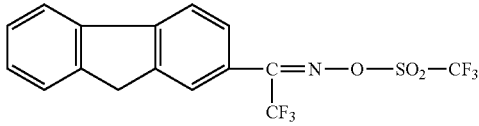
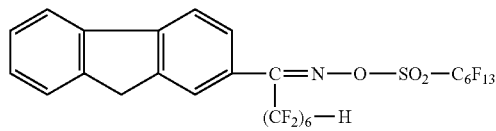

Of the above exemplary compounds, the following three compounds (iv), (v), and (vi) are preferred.

[Formula 12]

(iv)

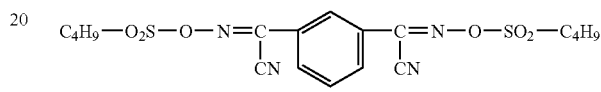

[Formula 13]

(v)

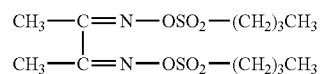

[Formula 14]

(vi)

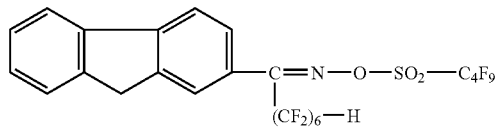

Among the diazomethane-based acid generators, specific examples of bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include
1,3-bis(phenylsulfonyldiazomethylsulfonyl)propane (A=3),
1,4-bis(phenylsulfonyldiazomethylsulfonyl)butane (A=4),
1,6-bis(phenylsulfonyldiazomethylsulfonyl)hexane (A=6),
1,10-bis(phenylsulfonyldiazomethylsulfonyl)decane (A 10),
1,2-bis(cyclohexylsulfonyldiazomethylsulfonyl)ethane (B=2),
1,3-bis(cyclohexylsulfonyldiazomethylsulfonyl)propane (B=3),
1,6-bis(cyclohexylsulfonyldiazomethylsulfonyl)hexane (B=6), and
1,10-bis(cyclohexylsulfonyldiazomethylsulfonyl)decane (B1=10), the structures of which are (vii) and (viii) shown below.

[Formula 15]

(vii)

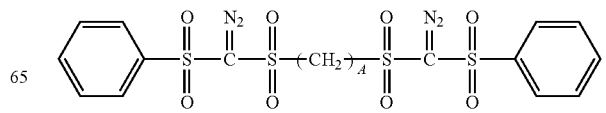

-continued

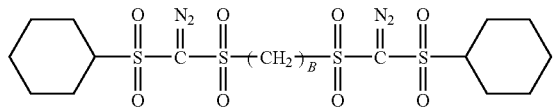
(viii)

In the present invention, of the above compounds, an onium salt with a fluorinated alkylsulfonate ion or an alkylsulfonate ion as the anion is preferably used as the component (B).

As the component (B), either a single acid generator or a combination of two or more different acid generators may be used.

The quantity of the component (B) is within a range from 0.5 to 30 parts by weight, preferably from 1 to 15 parts by weight, and most preferably from 5 to 10 parts by weight, relative to 100 parts by weight of the component (A). If the quantity is within the above range, pattern formation can progress satisfactorily. Moreover, it is preferable to have the quantity within the range, since a uniform solution can be obtained, and the storage stability of the composition becomes satisfactory.

<Component (C)>

There are no particular restrictions on the component (C), and any known cross-linking agent component that has been used for conventional chemically amplified negative resist compositions can be used.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxan-2,3-diol, and 1,3,5-trihydroxycyclohexane.

Moreover, other examples include compounds produced by reacting an amino group-containing compound, such as melamine, acetoguanamine, benzoguanamine, urea, ethylene urea, propylene urea, or glycoluril, with either formaldehyde or a mixture of formaldehyde and a lower alcohol, thereby substituting a hydrogen atom of the amino group with a hydroxymethyl group or a lower alkoxymethyl group.

Among such compounds, those that use melamine are referred to as melamine-based cross-linking agents, those that use urea are referred to as urea-based cross-linking agents, those that use alkylene urea such as ethylene urea and propylene urea are referred to as alkylene urea-based cross-linking agents, and those that use glycoluril are referred to as glycoluril-based cross-linking agents.

As the component (C), one or more compounds selected from a group consisting of melamine-based cross-linking agents, urea-based cross-linking agents, alkylene urea-based cross-linking agents, and glycoluril-based cross-linking agents are preferred. Urea-based cross-linking agents or glycoluril-based cross-linking agents are more preferred, and glycoluril-based cross-linking agents are particularly preferred.

Examples of melamine-based cross-linking agents include compounds produced by reacting melamine and formaldehyde, thereby substituting a hydrogen atom of the amino group with a hydroxymethyl group, and compounds produced by reacting melamine, formaldehyde, and a lower alcohol, thereby substituting a hydrogen atom of the amino group with a lower alkoxymethyl group. Specific examples thereof include hexamethoxymethylmelamine, hexaethoxymethylmelamine, hexapropoxymethylmelamine, and hexabutoxybutylmelamine. Of these, hexamethoxymethylmelamine is preferred.

Examples of urea-based cross-linking agents include compounds produced by reacting urea and formaldehyde, thereby substituting a hydrogen atom of the amino group with a hydroxymethyl group, and compounds produced by reacting urea, formaldehyde, and a lower alcohol, thereby substituting a hydrogen atom of the amino group with a lower alkoxymethyl group. Specific examples thereof include bismethoxymethylurea, bisethoxymethylurea, bispropoxymethylurea, and bisbutoxymethylurea. Of these, bis methoxymethylurea is preferred.

Examples of alkylene urea-based cross-linking agents include compounds represented by the following general formula (III).

[Formula 16]

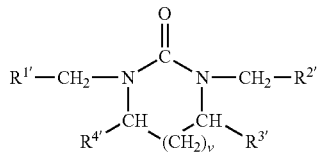
(III)

[In the formula, $R^{1'}$ and $R^{2'}$ each represent, independently, a hydroxyl group or a lower alkoxy group; $R^{3'}$ and $R^{4'}$ each represent, independently, a hydrogen atom, a hydroxyl group, or a lower alkoxy group; and v is 0, 1, or 2.]

When each of $R^{1'}$ and $R^{2'}$ is a lower alkoxy group, the alkoxy group preferably has carbon atoms of 1 to 4, and may be either a linear or branched group. $R^{1'}$ and $R^{2'}$ may be the same, or may be different from each other. More preferably, $R^{1'}$ and $R^{2'}$ are the same.

When each of $R^{3'}$ and $R^{4'}$ is a lower alkoxy group, the alkoxy group preferably has carbon atoms of 1 to 4, and may be either a linear or branched group. $R^{3'}$ and $R^{4'}$ may be the same, or may be different from each other. More preferably, $R^{3'}$ and $R^{4'}$ are the same.

v is 0, 1 or 2, and preferably 0 or 1.

In particular, the alkylene urea-based cross-linking agent is preferably a compound in which v is 0 (ethylene urea-based cross-linking agent) and/or a compound in which v is 1 (propylene urea-based cross-linking agent).

The compounds represented by the above general formula (III) can be obtained by the condensation reaction of alkylene urea and formaldehyde, or by the reaction of the product obtained above with a lower alcohol.

Specific examples of alkylene-urea based cross-linking agents include ethylene urea-based cross-linking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; 1,3-di(methoxymethyl)-4,5-dihydroxy-2-imidazolidinone, and 1,3-di(methoxymethyl)-4,5-dimethoxy-2-imidazolidinone.

Examples of glycoluril-based cross-linking agents include glycoluril derivatives in which the N-position is substituted with a hydroxyalkyl group and/or an alkoxyalkyl group of 1 to 4 carbon atoms. Such glycoluril derivatives can be obtained by the condensation reaction of glycoluril and formaldehyde, or by the reaction of the product obtained above with a lower alcohol.

Specific examples of glycoluril-based cross-linking agents include mono-, di-, tri- and/or tetra-hydroxymethylglycoluril, mono-, di-, tri- and/or tetra-methoxymethylated glycoluril, mono-, di-, tri- and/or tetra-ethoxymethylglycoluril, mono-, di-, tri- and/or tetra-propoxymethylated glycoluril, and mono-, di-, tri- and/or tetra-butoxymethylated glycoluril.

As to the component (C), either a single cross-linking agent can be used alone, or a combination of two or more different cross-linking agents can be used.

The quantity of the component (C) is preferably within a range from 3 to 30 parts by weight, more preferably from 3 to 15 parts by weight, and the most preferably from 5 to 15 parts by weight, relative to 100 parts by weight of the component (A). If the quantity of component (C) is not less than the lower limit, cross-linking formation progresses satisfactorily, and a satisfactory resist pattern can be obtained. Moreover, if the quantity is not more than the upper limit, the storage stability of the resist coating liquid becomes satisfactory, and the deterioration in the sensitivity over time can be suppressed.

<Other Optional Components>

In a negative resist composition of the present invention, in order to improve the resist pattern shape and the post exposure stability of the latent image formed by the pattern-wise exposure of the resist layer, a nitrogen-containing organic compound (D) (hereinafter referred to as the component (D)) can also be added as an optional component.

A multitude of different compounds have already been proposed for this component (D), and any of these known compounds can be used. Examples thereof include: monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, secondary and tertiary aliphatic amines are preferred, trialkylamines of 5 to 10 carbon atoms are more preferred, and tri-n-octylamine is most preferred.

These compounds may be used alone, or used in combinations of two or more different compounds.

This component (D) is typically added in the quantity within a range from 0.01 to 5.0 parts by weight, relative to 100 parts by weight of the component (A).

In a negative resist composition of the present invention, in order to prevent the deterioration in the sensitivity caused by the addition of the aforementioned component (D), and improve the resist pattern shape and the post exposure stability of the latent image formed by the pattern-wise exposure of the resist layer, (E) an organic carboxylic acid, or a phosphorus oxo acid or derivative thereof (hereinafter referred to as the component (E)) can also be added as an optional component. Either one or both of the component (D) and the component (E) can be used.

Examples of organic carboxylic acids include malonic acid, citric acid, malic acid, succinic acid, benzoic acid, and salicylic acid.

Examples of phosphorus oxo acids or derivatives thereof include phosphoric acid or derivatives thereof, such as phosphoric acid, di-n-butyl phosphate, and diphenyl phosphate; phosphonic acid or derivatives thereof, such as phosphonic acid, dimethyl phosphonate, di-n-butyl phosphonate, phenylphosphonic acid, diphenyl phosphonate, and dibenzyl phosphonate; and phosphinic acid or derivatives thereof, such as phosphinic acid and phenylphosphinic acid. Of these, phosphonic acid is particularly preferred.

This component (E) is typically added in the quantity within a range from 0.01 to 5.0 parts by weight, relative to 100 parts by weight of the component (A).

Other miscible additives can also be added to a negative resist composition of the present invention according to need, and examples thereof include additive resins for improving the properties of the resist film, surfactants for improving the ease of application, dissolution inhibitors, plasticizers, stabilizers, colorants, halation prevention agents, and dyes.

<Organic Solvent>

A negative resist composition according to the present invention can be produced by dissolving the aforementioned component (A), component (B), component (C), and various optional components in an organic solvent.

The organic solvent may be any of the solvents capable of dissolving the components to be used, and giving a uniform solution. One or more solvents selected from known materials used as the solvents for conventional chemically amplified resists can be used.

Specific examples thereof include: lactones such as 7-butyrolactone; ketones such as acetone, methyl ethyl ketone, cyclohexanone, methyl isoamyl ketone, and 2-heptanone; polyhydric alcohols and derivatives thereof such as monomethyl ether, monoethyl ether, monopropyl ether, monobutyl ether, or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used alone, or as a mixed solvent containing two or more different solvents.

Furthermore, mixed solvents of propylene glycol monomethyl ether acetate (PGMEA) and a polar solvent are preferred. The mixing ratio (weight ratio) can be determined with accordance with the factors such as the co-solubility of PGMEA and the polar solvent, and the ratio is preferably within a range from 1:9 to 9:1, and even more preferably from 2:8 to 8:2.

More specifically, in those cases where EL is mixed as the polar solvent, the weight ratio PGMEA:EL is preferably within a range from 1:9 to 9:1, and even more preferably from 2:8 to 8:2.

Furthermore, other preferred organic solvents include mixed solvents of at least one of PGMEA and EL with γ-butyrolactone. In such cases, the mixing ratio between the former and the latter components is preferably a weight ratio within a range from 70:30 to 95:5.

There are no particular restrictions on the quantity of organic solvent used, and the quantity can be set within the concentration that is suitable for application to the substrate, in accordance with the desired resist film thickness. Generally, the quantity of the organic solvent is set so that the solid fraction concentration of the resist composition is within the range from 2 to 20% by weight, and preferably 5 to 15% by weight.

[Method of Forming a Resist Pattern]

A method of forming a resist pattern according to the present invention includes the steps of: forming a resist film using a negative resist composition of the present invention onto a substrate; exposing the resist film; and developing the resist film to form a resist pattern.

More specifically, a resist pattern can be formed by the method of forming a resist pattern as follows. First, a negative resist composition described above is applied to a substrate such as a silicon wafer using a spinner or the like, and a prebake (PAB) is then optionally applied, thereby forming a resist film. The formed resist film is subjected to selective exposure by light exposure through a mask pattern, or by drawing with direct irradiation of electron beams without a mask pattern, using an exposure apparatus such as an electron beam lithography system and an EUV exposure apparatus, and then subjected to PEB (post exposure baking) treatment.

Subsequently, developing treatment is performed using an alkali developing solution, and then the developing solution on the substrate and the resist components dissolved in the developing solution are washed out by rinsing treatment. The substrate is then dried to obtain a resist pattern.

These steps can be performed using a known method. Preferably, the condition of operation is set in accordance with the makeup or the properties of the negative resist composition to be used.

There are no particular restrictions on the exposure light source, and the exposure can be performed using radiation sources such as an ArF excimer laser, a KrF excimer laser, an $F_2$ excimer laser, EUV (extreme ultraviolet), VUV (vacuum ultraviolet), electron beam, X-ray, and soft X-ray. Particularly a negative resist composition according to the present invention is effective for electron beam or EUV, more particularly for electron beam.

According to circumstances, postbaking may be included after the above alkali developing, and an organic or inorganic anti-reflection film may be provided between the substrate and the resist film.

As described above, according to a negative resist composition of the present invention, and a method of forming a resist pattern using the negative resist composition, a resist pattern with high sensitivity and high resolution can be formed. The reason can be considered that: the polyhydric phenol compound (A1) has a high alkali solubility; the alkali solubility is hardly affected by other components in the resist such as the component (B); the polyhydric phenol compound (A1) has a high cross-linking reactivity with and component (C); and the polyhydric phenol compound (A1) has a self cross-linking property.

That is, a conventional resist that uses a resin as the component (A) is easily affected by the component (B) or the like. For example, as described above, if the quantity of the component (B) is increased to improve the sensitivity, the solubility of the resist is decreased, bringing a tendency in which the resolution is lowered and a resist pattern can not be formed, and thus there is a large restriction on the quantity of the component (B).

On the other hand, in the present invention, the alkali solubility is high and sufficient resolution can be obtained even if the quantity of the component (B) is increased, and thus the sensitivity can be improved. Further, since the cross-linking reactivity of the polyhydric phenol compound (A1) with the component (C) is high, and the self cross-linking property of the polyhydric phenol compound (A1) exists, then exposed portions are rapidly converted to an alkali insoluble state. For these reasons, it is considered that the resist pattern with high sensitivity and high resolution can be formed.

Furthermore, in the present invention, since the polyhydric phenol compound (A1) is a low molecular compound, the reduction of the roughness can also be expected.

EXAMPLES

Hereunder is a description of examples of the present invention, but the present invention is not limited in no way by the examples.

Examples 1 to 6 and Comparative Example 1

The respective components shown in Table 1 were mixed and dissolved to obtain a negative resist composition solution.

TABLE 1

| | (A) Component | (B) Component | (C) Component | (D) Component | (E) Component | Organic solvent |
|---|---|---|---|---|---|---|
| Example 1 | Component 1 [100] | PAG1 [12.6] | Binder 1 [10] | Amine1 [0.38] | ADD1 [0.3] | PGME [1560] |
| Example 2 | Component 1 [100] | PAG1 [12.6] | Binder 2 [10] | Amine1 [0.38] | ADD1 [0.3] | PGME [1560] |
| Example 3 | Component 1 [100] | PAG1 [12.6] | Binder 3 [10] | Amine1 [0.38] | ADD1 [0.3] | PGME [1560] |
| Example 4 | Component 2 [100] | PAG1 [12.6] | Binder 1 [10] | Amine1 [0.38] | ADD1 [0.3] | PGME [1560] |
| Example 5 | Component 2 [100] | PAG1 [12.6] | Binder 2 [10] | Amine1 [0.38] | ADD1 [0.3] | PGME [1560] |
| Example 6 | Component 2 [100] | PAG1 [12.6] | Binder 3 [10] | Amine1 [0.38] | ADD1 [0.3] | PGME [1560] |
| Comparative Example 1 | Resin 1 [100] | PAG1 [6.0] | Binder 1 [10] | Amine1 [0.75] | ADD1 [0.3] | PGME [1560] |

In Table 1, each of numerical values in the bracket [ ] show a blend quantity (part by weight).

Compound 1 (manufactured by Honshu Chemical Industry Co., Ltd.), Compound 2 (manufactured by Honshu Chemical Industry Co., Ltd.), and Binders 1 to 3 (manufactured by Sanwa Chemical Co., Ltd.): compounds having the following structures.

Resin 1: copolymer containing 80 mol % of p-hydroxystyrene and 20 mol % of styrene (mass average molecular weight of 3600 and degree of dispersion of 2.0, manufactured by Nippon Soda Co., Ltd.)

PAG1: triphenylsulfonium nonafluorobutanesulfonate

Amine 1: tri-n-octylamine

ADD1 salicylic acid

PGME: propylene glycol monomethylether

[Formula 17]

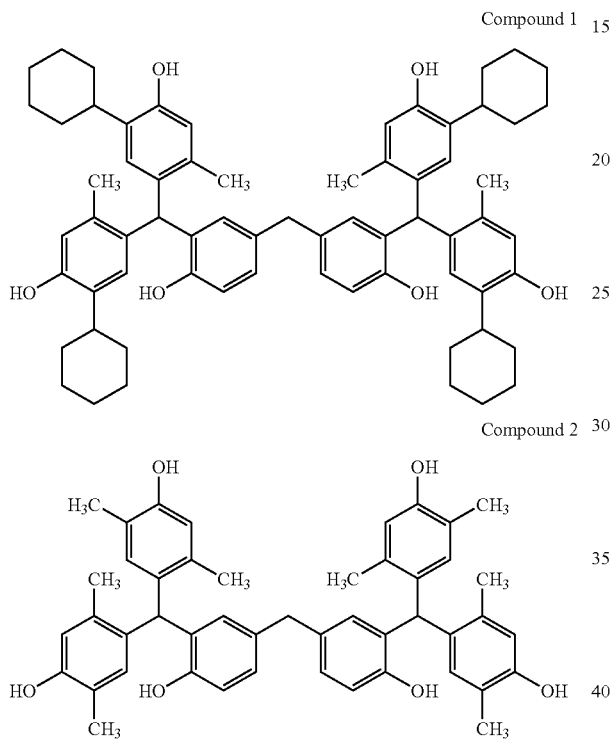

[Formula 18]

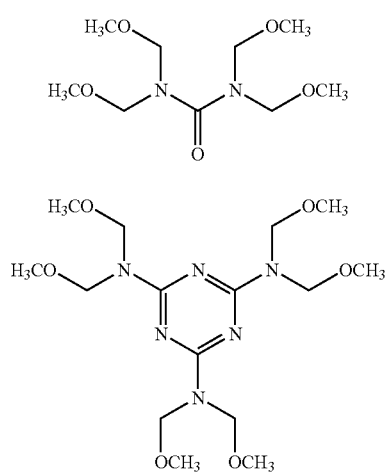

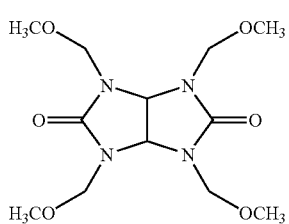

Next, the obtained negative resist composition solution was evaluated as follows.

<Resolution>

The negative resist composition solution was evenly applied to an 8-inch silicon wafer substrate using a spinner, and was then prebaked (PAB) at 100° C. for 90 seconds, thus forming a resist film (film thickness of 125 nm).

Drawing (light exposure) was performed on the resist film using an electron beam lithography system HL-800D (VSB) (manufactured by Hitachi, Ltd.) at an acceleration voltage of 70 kV, and was then baked (PEB) at 110° C. for 90 seconds, followed by developing for 60 seconds using a 2.38% by weight aqueous solution (23° C.) of tetramethylammoniumhydroxide (TMAH), and rinsing with pure water for 30 seconds.

As a result, in examples 1 to 6, the isolated space patterns of 50 nm and the line and space (L/S) patterns with a 1:1 ratio of 50 nm were formed.

In contrast, in comparative example 1, the resist in space portions was not completely removed, and the isolated space pattern of 50 nm could not be formed.

<Sensitivity>

The exposure amount ($\mu C/cm^2$) at which the isolated space patterns of 50 nm could be formed was obtained.

The results are shown in Table 2.

TABLE 2

| | Resolution (nm) | Sensitivity ($\mu C/cm^2$) |
|---|---|---|
| Example 1 | 50 | 17 |
| Example 2 | 50 | 25 |
| Example 3 | 50 | 19 |
| Example 4 | 50 | 17 |
| Example 5 | 50 | 27 |
| Example 6 | 50 | 17 |
| Comparative Example 1 | — | — |

As apparent from the above results, the examples 1 to 6 each enabled the formation of a resist pattern with high sensitivity and high resolution. Of these, particularly, the examples 1, 3, 4, and 6 using the binder 1 or 3 showed high sensitivity.

In contract, in the comparative example 1 using the resin 1 as the component (A), a 50 nm pattern was not able to be formed.

INDUSTRIAL APPLICABILITY

The negative resist composition and the method of forming a resist pattern of the present invention are capable of forming a resist pattern with high sensitivity and high resolution, and can be applied to a negative resist composition and the formation of a resist pattern.

The invention claimed is:

1. A negative resist composition comprising an alkali soluble base component (A), an acid generator component (B) that generates acid by exposure, and a cross-linking agent component (C),
wherein said base component (A) comprises a polyhydric phenol compound (A1) containing two or more phenolic hydroxyl groups represented by the following general formula (I), with a molecular weight of 300 to 2500 and the proportion of said polyhydric phenol compound (A1) is more than 50% by weight in said component (A):

[Formula 1]

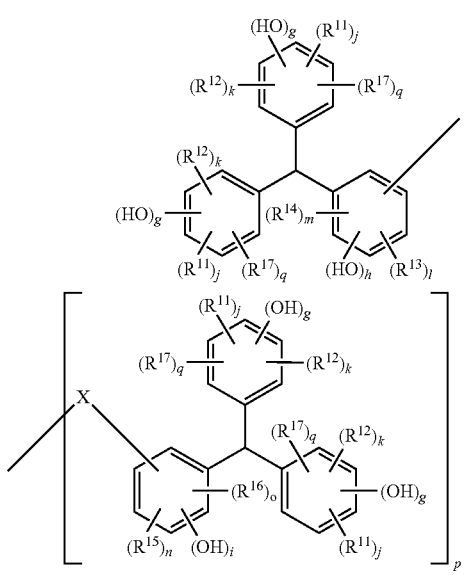

where in the formula (I), $R^{11}$ to $R^{17}$ each represent, independently, an alkyl group of 1 to 10 carbon atoms, or an aromatic hydrocarbon group, which may contain hetero atoms in the structure; g and j each represent, independently, an integer of 1 or more; k and q each represent, independently, an integer of 0 or more; g+j+k+q is 5 or less; h represents an integer of 1 or more; l and m each represent, independently, an integer of 0 or more; h+l+m is 4 or less; i represents an integer of 0 or more ; n and o each represent, independently, an integer of 0 or more; i+n+o is 4 or less; p represents 0 or 1; and X is a group represented by the following general formula (Ia) or (Ib):

[Formula 2]

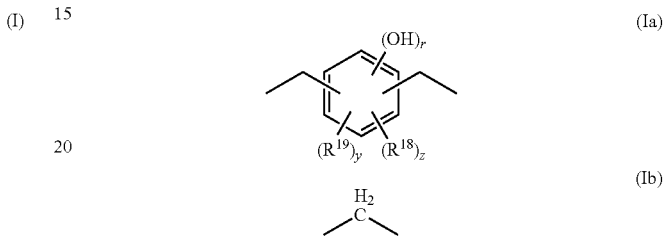

where in the formula (Ia), $R^{18}$ and $R^{19}$ each represent, independently, an alkyl group of 1 to 10 carbon atoms, or an aromatic hydrocarbon group, which may contain hetero atoms in the structure; r, y, and z each represent, independently, an integer of 0 or more, and r+y+z is 4 or less.

2. A negative resist composition according to claim 1, further comprising a nitrogen-containing organic compound (D).

3. A method of forming a resist pattern forming a resist film onto a substrate using a negative resist composition according to claim 1 or claim 2; exposing the resist film; and developing the resist film to form a resist pattern.

* * * * *

UNITED STATES PATENT AND TRADEMARK OFFICE
CERTIFICATE OF CORRECTION

PATENT NO. : 7,981,588 B2
APPLICATION NO. : 11/813511
DATED : July 19, 2011
INVENTOR(S) : Takako Hirosaki, Taku Hirayama and Daiju Shiono It is certified that error appears in the above-identified patent and that said Letters Patent is hereby corrected as shown below:

At Column 3, Line 20 (Approx.), Change "represent" to --represent,--.

At Column 7, Line 52, Change "(a)," to --(A),--.

At Column 7, Line 53, Change "(Al)" to --(A1)--.

At Column 9, Line 35, Change "$R^{6"1"}$" to --$R^{6"}$--.

At Column 18, Line 48, Change "(A 10)," to --(A=10),--.

At Column 18, Line 56, Change "(B1=10)," to --(B=10),--.

At Column 20, Line 32, Change "$R^{41"}$" to --$R^{4'}$--.

At Column 20, Line 45, Change "1 or" to --1, or--.

At Column 22, Line 33, Change "7-" to --γ- --.

At Column 27, Line 9, In Claim 1, change "2500" to --2500,--.

At Column 28, Line 7, In Claim 1, change "1 and m" to --l and m--.

At Column 28, Line 8, In Claim 1, change "h+1+m" to --h+l+m--.

At Column 28, Line 9, In Claim 1, change "more ;" to --more;--.

At Column 28, Line 34 (Approx.), In Claim 3, after "pattern" insert --comprising:--.

Signed and Sealed this
Tenth Day of January, 2012

David J. Kappos
*Director of the United States Patent and Trademark Office*